United States Patent [19]

Arakawa

[11] Patent Number: 5,253,200
[45] Date of Patent: Oct. 12, 1993

[54] ELECTRICALLY ERASABLE AND PROGRAMMABLE READ ONLY MEMORY USING STACKED-GATE CELL

[75] Inventor: Hideki Arakawa, Kanagawa, Japan

[73] Assignee: Sony Corporation, Japan

[21] Appl. No.: 814,582

[22] Filed: Dec. 30, 1991

Related U.S. Application Data

[63] Continuation of Ser. No. 283,795, Dec. 13, 1988, Pat. No. 5,136,541.

[30] Foreign Application Priority Data

Dec. 15, 1987 [JP] Japan .................................. 61-318172

[51] Int. Cl.⁵ .......................... G11C 8/00; G11C 11/34
[52] U.S. Cl. .................................... 365/185; 365/218; 365/230.06
[58] Field of Search ................... 365/185, 189.09, 218, 365/230.06, 189.11

[56] References Cited

U.S. PATENT DOCUMENTS

| | | | |
|---|---|---|---|
| 4,247,918 | 1/1981 | Iwahasai et al. | 365/185 |
| 4,368,524 | 1/1983 | Nakamura et al. | 365/189.09 |
| 4,446,536 | 5/1984 | Rodgers | 365/185 |
| 4,597,062 | 6/1986 | Asano et al. | 365/185 |
| 4,597,064 | 6/1986 | Giebel | 365/185 |
| 4,601,020 | 7/1986 | Arakawa et al. | 365/185 |
| 4,661,833 | 4/1987 | Mizutani | 365/185 |
| 4,692,904 | 9/1987 | Sato et al. | 365/189.09 |
| 4,758,984 | 7/1988 | Yoshida | 365/185 |
| 4,769,787 | 9/1988 | Furusawa et al. | 365/185 |
| 4,884,239 | 11/1989 | Ono et al. | 365/185 |

FOREIGN PATENT DOCUMENTS

| | | |
|---|---|---|
| 0023782 | 2/1981 | European Pat. Off. . |
| 0052566 | 5/1982 | European Pat. Off. . |
| 0108681 | 5/1984 | European Pat. Off. . |
| 0209812 | 1/1987 | European Pat. Off. . |

OTHER PUBLICATIONS

Applied Physics Letters, vol. 31, No. 7, Oct. 1, 1977, A New Approach for the Floating-gate MOS Nonvolatile Memory; A Hot-Hole ERasable Memory Cell.

A 256K Flass EEPROM Using Triple Polysilicon Tech.; IEEE, vol. 21, No. 10, A Single Transistor EEPROM Cell and Its Implementation In a 512K CMOS.

Primary Examiner—Joseph L. Dixon
Assistant Examiner—Michael A. Whitfield
Attorney, Agent, or Firm—Ronald P. Kananen

[57] ABSTRACT

An electrically erasable programmable nonvolatile memory device includes a plurality of memory cells. The memory device has architecture similar to or the same as an UV-EPROM. Erasure operating is performed by applying a negative voltage to a control gate so as to inject holes into the floating gate.

5 Claims, 4 Drawing Sheets

ELECTRICALLY ERASABLE AND PROGRAMMABLE READ ONLY MEMORY USING STACKED-GATE CELL

This application is a continuation of application Ser. No. 07/283,795 filed Dec. 13, 1988, now U.S. Pat. No. 5,136,541.

BACKGROUND OF THE INVENTION

FIELD OF THE INVENTION

The present invention relates generally to an electrically erasable nonvolatile memory, particularly an electrically erasable and programmable read-only-memory (EEPROM) or electrically alterable ROM (EAROM). More specifically, the invention relates to an EEPROM with a stacked-gate cell.

DESCRIPTION OF THE BACKGROUND ART

In recent years, various electrically erasable nonvolatile memories have been developed. However, such electrically erasable nonvolatile memories are disadvantageous for lower integration in comparison with ultraviolent ray erasable and programmable ROM (UV-EPROM). It has been considered that UV-EPROM is advantageous because each cell can be formed by one transistor. It is also considered that it is unlikely to obtain an EEPROM cell having a smaller cell size than that of an UV-EPROM.

For such UV-EPROM, need for one time PROM (OTP) which is fabricated on a plastic package has been growing in view of its practical use. In other words, the usual UV-EPROM which is fabricated on a ceramic serdip package with a crystal window is expensive because of the high cost for material of the package. On the other hand, in the practical use, an EPROM is programmed only one time similarly to that of an ordinary ROM.

Because OTP permits only one writing and does not permit data erasure in the cells, an inspection for writing data in each cell cannot be performed after fabricating the device. This encounters serious problem for maintaining satisfactory liability of the products. Namely, in case of ordinary fuse type or junction type PROM, since inspection can be performed by reading out stored data immediately after writing data, it is unnecessary to perform after assembling the package. However, in case of EPROM, a charge in a floating gate is apt to leak when a defective cell exists. This causes a retention problem resulting in a loss of written data. For this reason, for an EPROM, it is essential to perform an inspection for finding a read/write error so as to remove the product on which the read/write error is found. However, in case of an OTP, because it is not possible to perform inspection after assembling, removal of the defective product is not possible.

Some manufacturers request the user to perform aging at a temperature in a range of 125° C. to 150° C. after writing a program and thereafter performing a read test for removal of the defectives. Such an aging test is sometimes performed by the manufacturer when they offer program-writing service for the user. Despite such attempt, the difficulty of inspection after assembling borders for expansion of share of an EPROM remains.

In order to solve such problems, ISSCC Digest, page 168 to page 169, 1985; ISSCC Digest, page 76 to page 77, 1987; IEDM Digest, page 616 to page 619, 1985; and IEEE Electron Device Letter Vol. EDL-7, No. 8, 1986, page 465 to 467 propose an EEPROM having a memory cell size comparable with that of UV-EPROM.

For example, ISSCC Digest, page 76 to page 77, proposes an EEPROM which has an erase gate to which an electron is injected from a floating gate for performing erasure. Such architecture requires the additional erase gate. When technologies for fabricating the erase gate is applied to an UV-EPROM which enables the cell size of an UV-EPROM to be smaller than the present, an EEPROM cannot be comparable in integration. Furthermore, in the proposed architecture, a control gate is extended so as to place one end at an equal level to the floating gate in parallel to the floating gate above a channel. Such construction necessarily increases bulk thereof so as not to allow desired integration.

On the other hand, IEDM Digest, page 616 to 617 proposes electrical erasure technologies for a memory cell having the same structure as UV-EPROM. In the proposal, a high potential is applied to a source region to inject an electron in the source region. Because the cell has the same structure, integration becomes equal to the UV-EPROM. Such technology is advantageous in view of integration but encounters difficulty in assurance of erasure of data. Namely, the cells aligned on each word line have source regions connected to each other. Therefore, erasure of the cells on one word line is performed simultaneously by applying equal voltages, e.g. +1.5 V, in theory. However, due to delicate fluctuation in the electrical condition in the floating gate and the gate insulation layer, threshold levels at respective cells tends to be fluctuated. This causes variation of the threshold level at a respective cell by erasure operation. For instance, in some cells, an erasure may cause the threshold level to be set at a standard threshold level, e.g. +1.0 V. On the other hand, in some cells an over-erasure which may cause a substantially low threshold level, e.g. −1.5 V can occur. Such cells having a negative threshold level may operates in a depletion mode. For this reason, practical implementation of this technology is hardly expected.

On the other hand, IEEE electron Device Letter Vol. EDL-7, No. 8, 1986, page 465 to page 467 discloses erasure technology for memory cells, each having an identical structure to UV-EPROM. In the proposed technology, an erasure pulse varies its level between 0 V to write level for writing data in the floating gate. This technology is established based on a discovery of the phenomena in that holes enter into floating gate in response to trailing edge of HIGH level pulse. This technology has poor reliability. Furthermore, in erasure, a substantial level of drain current which is comparable with that required for writing, e.g. several mA for each bit, is required. Therefore, only one to several words can be erased simultaneously. Because of unacceptably low erasure efficiency, this proposal is not adapted for practical implementation.

SUMMARY OF THE INVENTION

Therefore, it is an object of the present invention to provide an EEPROM which has erasure performance with satisfactorily small cell size.

Another object of the invention is to provide an EEPROM with stacked gate cells.

In order to accomplish the aforementioned and other objects, an EEPROM, according to the present invention, has architecture similar to or same as UV-EPROM. Erasure operating is performed by applying a negative voltage to a control gate so as to inject holes into the floating gate.

According to one aspect of the invention, an erasable programmable nonvolatile memory device comprises:
a plurality of memory cells, each memory cell including:
a semiconductor region;
source and drain regions formed in the semiconductor region;
a channel region formed between the source and drain regions;
a floating gate formed above the channel region;
a first insulating layer disposed between the channel region and the floating gate;
a control gate formed above the floating gate;
a second insulating layer disposed between the floating gate and the control gate; and
means for applying a positive voltage to the control gate for injecting electrons in the floating gate for writing and applying a negative voltage to the control gate for injecting holes in the floating gate for erasure.

Preferably, the means selectively perform erasure operation for each memory cell. In the alternative, the means may simultaneously perform an erasure operation for each memory cell block composed of a plurality of memory cells.

The means may comprise a negative voltage source means fabricated in a common package to the memory cells. Also the means may be connected to the control gate of the memory cells via a word line which is connected to a word line decoder via a transferring MOS transistor, the MOS transistor being formed in a well region of the semiconductor region. In such case, the transferring MOS transistor is designed for operation in a duplication mode.

Further preferably, the means applies negative voltage for a control gate of a selected memory cell and positive voltage for a control gate of a memory cell which is not selected. In the alternative, the control gates of the respective memory cells are connected to a word line decoder via a plurality of word lines, and the means sets the level of the word lines selected for erasure at a LOW level of the word lines which are not selected, sets levels of the word lines at a HIGH level, and subsequently applies the negative voltage for selected word lines. In the further alternative, the control gates of the respective memory cells are connected to a word line decoder via a plurality of word lines, and the means latches outputs of the word line decoder, sets levels of all of the word lines at a LOW level, and subsequently applies the negative voltage for the word lines selected for erasure.

According to another aspect of the invention, an erasable programmable nonvolatile memory device comprises:
a plurality of memory cells, each including a semiconductor region defining therein a source region, a drain region and a channel region defined between the source and drain regions, a floating gate formed above the channel region and insulated therefrom, and a control gate formed above the floating gate and insulated therefrom, the memory cell being designed for writing in a bit data by injecting electrons in the floating gate; and
means for applying a erasure voltage to the control gate for lowering gate junction breakdown voltage at a junction between the semiconductor region and the drain region, and applying a drain voltage for causing breakdown at the junction so as to inject holes in the floating gate for erasure.

preferably, the means transfers the erasure voltage through the word line. The memory cells and the means are composed in a single package.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings:

FIGS. 2(A) and 2(B) show a negative voltage generator circuit, in which FIG. 2(A) shows a structure of the negative voltage generator circuit and FIG. 2(B) shows a circuit diagram of an equivalent circuit to the device of FIG. 2(A);

DESCRIPTION OF THE PREFERRED EMBODIMENT

Figure 1:
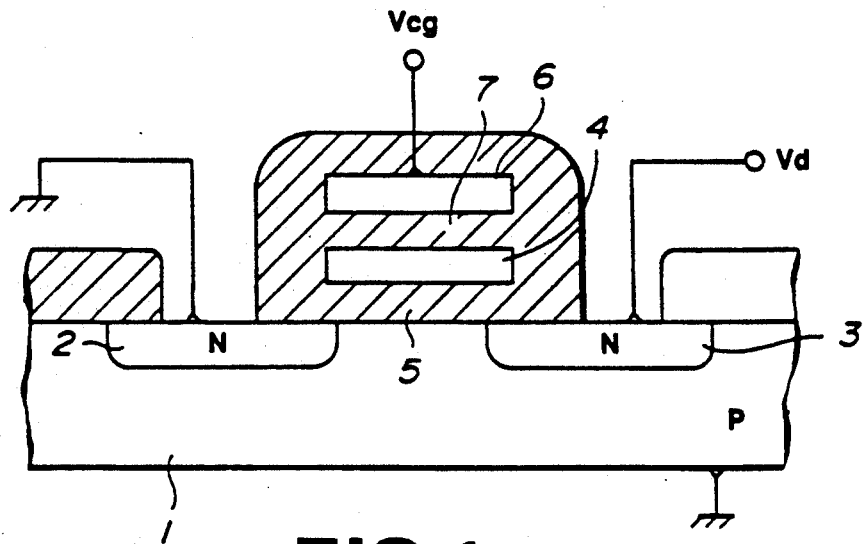
FIG. 1 is a section of a memory cell forming part of the preferred embodiment of an EEPROM according to the present invention.

Referring now to the drawings, the preferred embodiment of an erasable programmable nonvolatile memory device, according to the present invention, will be described herebelow with reference to FIGS. 1 to 3.

Figure 2:
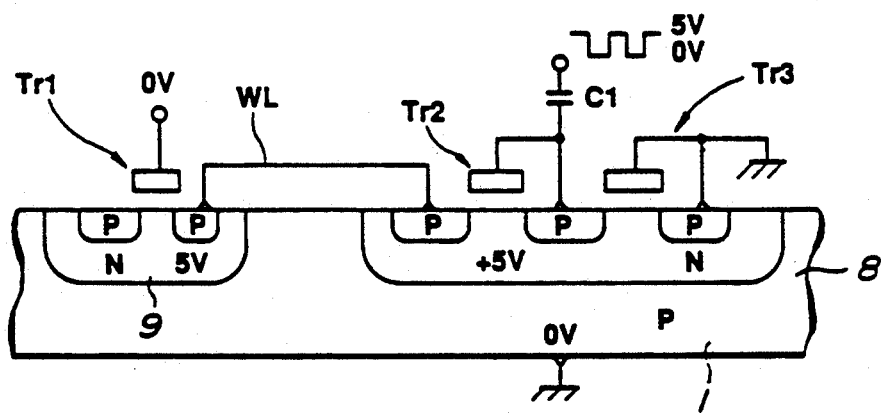
Figure 2:
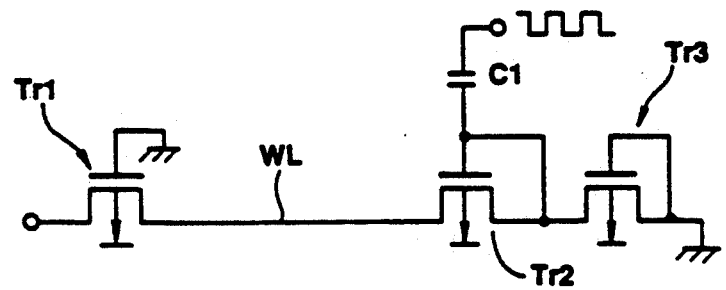

FIG. 1 shows a cross section of a memory cell forming a part of the preferred embodiment of he erasable programmable nonvolatile memory device. As will be appreciated from FIG. 1, the memory cell in the preferred embodiment of the erasable programmable nonvolatile memory device has a stacked gate structure. Namely, as seen from FIG. 1, N type source region 2 and N type drain region 3 are formed on a P type semiconductor substrate 1. A floating gate 4 is formed above a channel between the source region 2 and the drain region 3 and opposes the channel via a gate insulation layer 5. A control gate 6 is formed above the floating gate 4 in opposition to the latter via a gate insulation layer 7. To the control gate 6, a control gate voltage $V_{cg}$ is applied. Similarly, to the drain region 3, a drain voltage $V_d$ is applied.

As will be seen from FIG. 1, the shown structure of the memory cell employed in the preferred embodiment of the erasable programmable nonvolatile memory device according to the present invention, is the same as that in an UV-EPROM.

In order to write in a program in the memory cell set forth above, a predetermined voltage, e.g. +7 to +12 V of drain voltage $V_d$ is applied to the drain region 3. Simultaneously, a predetermined voltage, e.g. +12.5 V, of the control gate voltage $V_{cg}$ is applied to the control gate 6. By this, an avalanche current is created to flow between the drain region 3, the source region 2 and the semiconductor substrate 1. The avalanche current further generates substrate current in the semiconductor substrate 1. As a result, electrons are injected into the floating gate 4 via a pinch off region formed in the vicinity of the drain region 3.

The process of programming set forth above is identical to that in the UV-EPROM.

In reading out the written data from the memory cell, a positive voltage is applied the control gate 6. In case that the memory cell has a written data, the floating gate 4 is charged by negative voltage. Therefore, when the positive voltage is applied to the control gate 6, the memory cell is maintained in a non-conductive state due to presence of a negative voltage in the floating gate 4. On the other hand, when the memory cell has no written data, the channel region between the source region 2 and the drain region 3 is converted into N type by the positive voltage applied to the control gate 6. Thus, the memory cell becomes conductive. Therefore, by applying the positive voltage to the control gate 6, and discriminating whether the corresponding memory cell is conductive or non-conductive, data can be read out. This process of reading out the written data is also identical to that in the UV-EPROM.

In an erasure operation of a UV-EPROM, ultraviolent ray is irradiated on the UV-EPROM for exciting the electron in the floating gate 4 with an energy great enough to move over the insulating layers 5 and 7 to be absorbed in the insulating layers 5 and 7. In contrast to this, the erasure in the shown embodiment of the erasable programmable nonvolatile memory device according to the present invention, is performed by applying a predetermined negative voltage, e.g. $-3$ to $-10$ V to the control gate 6. Simultaneously, a drain voltage $V_d$ equivalent to that applied in writing is applied to the drain region 3. This causes electrical erasure of the written data in the memory cell. Namely, when the negative voltage $V_{cg}$ is applied to the control gate 6, the gated junction breakdown voltage at the PN junction between the drain region 3 and the substrate 1 is lowered so that the PN junction is easily broken down. At this condition, the drain voltage $V_d$ equivalent to that applied in writing is applied to cause a breakdown in the PN junction below the floating gate 4. At the same time, in the pinch off region, pairs of electrons and holes are generated. Because of the negative voltage of the control gate voltage $V_{cg}$, the electric field formed in the memory cell is opposite to that generated in the writing operation. As a result, holes in the pinch off region are injected into the floating gate 4 to lower the charge level in the floating gate to zero or approximately zero.

As is well known, the gate insulating layer 5 formed by an oxide layer, has a high energy barrier property so as not to allow injection of holes to the floating gate. However, the energy level of the holes generated by breakdown is sufficiently high to be injected over the energy barrier of the insulating layer 5. Furthermore, since the amount of holes and electrons, in other words, the number of carriers, generated upon breakdown at the PN junction, is relatively large. Therefore, erasure can be completed in a relatively short period. Practically, the period required for erasure by applying the negative voltage as the control gate voltage $V_{cg}$ is equivalent to the writing in period.

As set forth, since the shown embodiment of the stacked gate structure EEPROM performs erasure by applying the negative voltage to the control gate 6 and positive voltage to the drain region 3, by selecting the word line, to which the control gate is connected and the bit line, to which the drain region is connected, each memory cell can be selectively erased. This means that the shown embodiment of an EEPROM allows the circuit to selectively erase each bit.

In addition, since the floating gate 4 holding written data is charged at the negative charge, the absolute value of the negative control gate voltage $V_{cg}$ required for forming an electric field suitable for injecting holes into the floating gate 4 can be reduced in a magnitude of the negative charge in the floating gate.

As set forth, in the shown embodiment of the erasable programmable nonvolatile memory device, i.e. EEPROM, according to the invention, performs an erasure operation by applying the negative voltage for the control gate 6. Of course, it is possible to connect the control gate 6 to the external negative voltage source for erasure operation. However, connecting the control gate to the external negative voltage source requires an additional terminal to increase the number of pins for interfacing. Therefore, it is advantageous to form a negative voltage generator circuit in the memory device. The preferred construction of a negative voltage generator circuit employed in the shown embodiment of the EEPROM is shown in FIGS. 2(A) and 2(B).

As shown in FIG. 2(A), the negative voltage generator circuit is formed on the semiconductor substrate 1. A N type semiconductor region 8 is formed on the P type semiconductor substrate. In the N type semiconductor region 8, P channel MOS transistors Tr$_2$ and Tr$_3$ are formed. These MOS transistors Tr$_2$ and Tr$_3$ are connected in series to each other. One end of the series circuit is connected to the ground. The other end of the series circuit is connected to a word line WL. As is well known, the word line WL is connected to the control gates 6 of a respective memory cell. At the junction between the MOS transistors Tr$_2$ and Tr$_3$, one end of a capacitor C$_1$ is connected. To the other end of the capacitor C$_1$ is connected to a source of pulses which vary the level between 0 V to 5 V. The Tr$_2$ and Tr$_3$ and the capacitor C$_1$ form a charge pump circuit for transferring negative voltage through the word line WL.

In practice, at the leading edge of the HIGH level pulse varying from 0 V to 5 V, the MOS transistor Tr$_3$ is turned ON. By this, a level at the junction between the MOS transistors Tr$_3$ and Tr$_2$ becomes zero or approximately zero including a level shift for V$_{th}$. Then, at the trailing edge of the HIGH level pulse varying from 5 V to 0 V the MOS transistor Tr$_3$ is turned OFF and the MOS transistor Tr$_2$ is turned ON. By this the source level of the MOS transistor Tr$_2$ is lowered according to lowering of the pulse level and becomes minus. Assuming the level shift of the V$_{th}$ of the MOS transistors Tr$_2$ and Tr$_3$ is 1 V, the negative voltage in a level of $-3$ V to $-5$ V can be generated. If greater negative voltage is required, a plurality of charge pump circuits may be formed and connected in series.

Another N type semiconductor region 9 is formed on the P type semiconductor substrate 1. A transferring P channel MOS transistor Tr$_1$ is formed in the N type semiconductor region 9. This transferring MOS transistor Tr$_1$ is provided for avoiding direct connection between the word line WL and the semiconductor substrate 1. Namely, the charge level in the word line WL becomes negative in relation to the charge level of the semiconductor substrate 1. When the charge of the word line WL is directly transferred to the N type semiconductor region 9, the negative voltage for an erasure operation causes a forward bias at the PN junction between the P type semiconductor substrate 1 and the N type semiconductor region 9 to establish a direct connection. The MOS transistor $Tr_1$ prevents the negative voltage in the word line WL from leaking to the P type semiconductor substrate.

Figure 3:
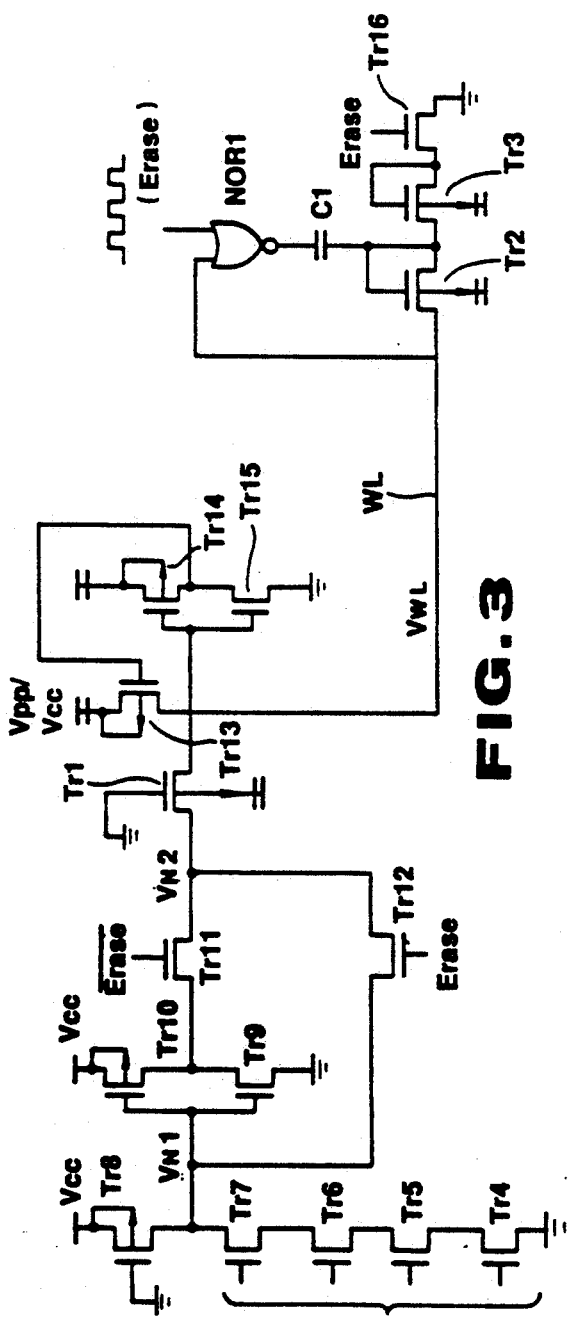
FIG. 3 is a circuit diagram of row decoder employing the preferred embodiment of EEPROM.

A practical application of the negative voltage generator circuit set forth above is shown in FIG. 3. As seen from FIG. 3, the negative voltage generator circuit is coupled with a row decoder. The preferred circuit construction according to the present invention is compared with the row decoder circuit employed in the conventionally known UV-EPROM.

Figure 4:
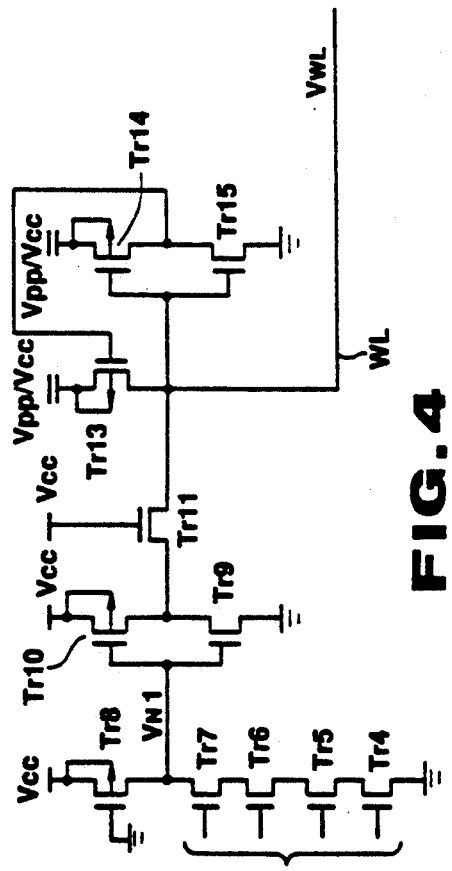
FIG. 4 is a circuit diagram of a comparative example of one of the typical constructions of the conventional row decoder.

As seen from FIGS. 3 and 4, the row decoder circuit includes N channel MOS transistors $Tr_4$, $Tr_5$, $Tr_6$ and $Tr_7$ which receive address signals from a pre-decoder (not shown). The row decoder also has a P channel MOS transistor $Tr_8$ serving as a load for the N channel transistors $Tr_4$, $Tr_5$, $Tr_6$ and $Tr_7$. These MOS transistors $Tr_4$, $Tr_5$, $Tr_6$, $Tr_7$ and $Tr_8$ form a decoding section. The row decoder circuit further includes a CMOS inverter constituted by N channel MOS transistor $Tr_9$ and P channel MOS transistors $Tr_{10}$. The CMOS inverter inverts the output signal $V_{N1}$ of the decoding section. The CMOS inverter is connected to the word line WL via a N channel MOS transistor $Tr_{11}$ and the transferring P channel MOS transistor $Tr_1$ for transferring the output of the CMOS inverter therethrough.

The N channel MOS transistor $Tr_{11}$ is designed to be driven by an erasure command $\overline{Erase}$. In the practical operation, the N channel MOS transistor $Tr_{11}$ is normally maintained in an ON state and turned into a OFF state in response to the erasure command $\overline{Erase}$. The junction between the MOS transistors $Tr_{11}$ and $Tr_1$ is connected to the output of the decoding section constituted by the N channel MOS transistors $Tr_4$, $Tr_5$, $Tr_6$ and $Tr_7$ via N channel transistor $Tr_{12}$. The N channel transistor $Tr_{12}$ is designed to be controlled by the erasure command $\overline{Erase}$ to be turned ON by the erasure command for inverting the logic of the voltage $V_{N2}$.

The CMOS inverter for inverting a voltage $V_{WL}$ on the word line WL is formed by P channel MOS transistor $Tr_{14}$ and N channel MOS transistor $Tr_{15}$. The output of this CMOS inverter is applied to a gate of P channel MOS transistor $Tr_{13}$ disposed between $V_{PP}/V_{CC}$ terminal and the word line WL. The circuit constituted by the MOS transistors $Tr_{13}$, $Tr_{14}$ and $Tr_{15}$ is designed for selectively applying $V_{PP}$ to the word line WL during programming and $V_{CC}$ during reading out.

The charge pump circuit including the P channel MOS transistors $Tr_2$ and $Tr_3$ and the capacitor $C_1$ is connected to the ground via N channel MOS transistor $Tr_{16}$. The N channel MOS transistor $Tr_{16}$ is controlled by the erasure command $\overline{Erase}$. The capacitor $C_1$ is also connected to a NOR gate $NOR_1$ which receives an erasure pulse at one input terminal and the word line voltage $V_{WL}$ of the word line WL.

The following table shows voltage levels at respective modes in various operation modes.

TABLE

|  | READ | | WRITE | | ERASE | |
| --- | --- | --- | --- | --- | --- | --- |
|  | S | N | S | N | S | N |
| $V_{PP}/V_{CC}$ | 5 V | 5 V | $V_{PP}$ | $V_{PP}$ | 5 V | 5 V |
| $V_{N1}$ | 0 V | 5 V | 0 V | 5 V | 0 V | 5 V |
| $V_{N2}$ | 5 V | 0 V | $V_{PP}$ | 0 V | 0 V | 5 V |
| $V_{WL}$ | 5 V | $V_{thp}$ | $V_{PP}$ | $V_{thp}$ | — | 5 V |
| SOURCE (CELL) | 0 V | 0 V | 0 V | 0 V | F1 | F1 |
| ERASE | 0 V | 0 V | 0 V | 0 V | 5 V | 5 V |

It should be noted that, in the table above, S represents selected and N represents not selected. $V_{PP}/V_{CC}$ represents the $V_{PP}/V_{CC}$ terminal in the row decoding system, for example $V_{PP}$ is $+12.5$ V and $V_{CC}$ is 5 V. Source is a source of the cell array. $V_{thp}$ is a threshold voltage of the P channel MOS transistor $Tr_1$, − represents a negative voltage, F1 is a floating gate. It should be noted, F1 can be replaced by 5 V.

In the circuit construction of FIG. 3, the row decoder circuit operates as follows. In response to an erasure command, the MOS transistor $Tr_{11}$ is turned OFF and the MOS transistor $Tr_{12}$ is turned ON, which states of the transistors is alternative to that in the normal state. Therefore, the logic is reversed. Therefore, the voltage $V_{N2}$ becomes 0 V when selected and +5 V when not selected. This causes the word line voltage $V_{WL}$ on the word line WL become negative.

Figure 5:
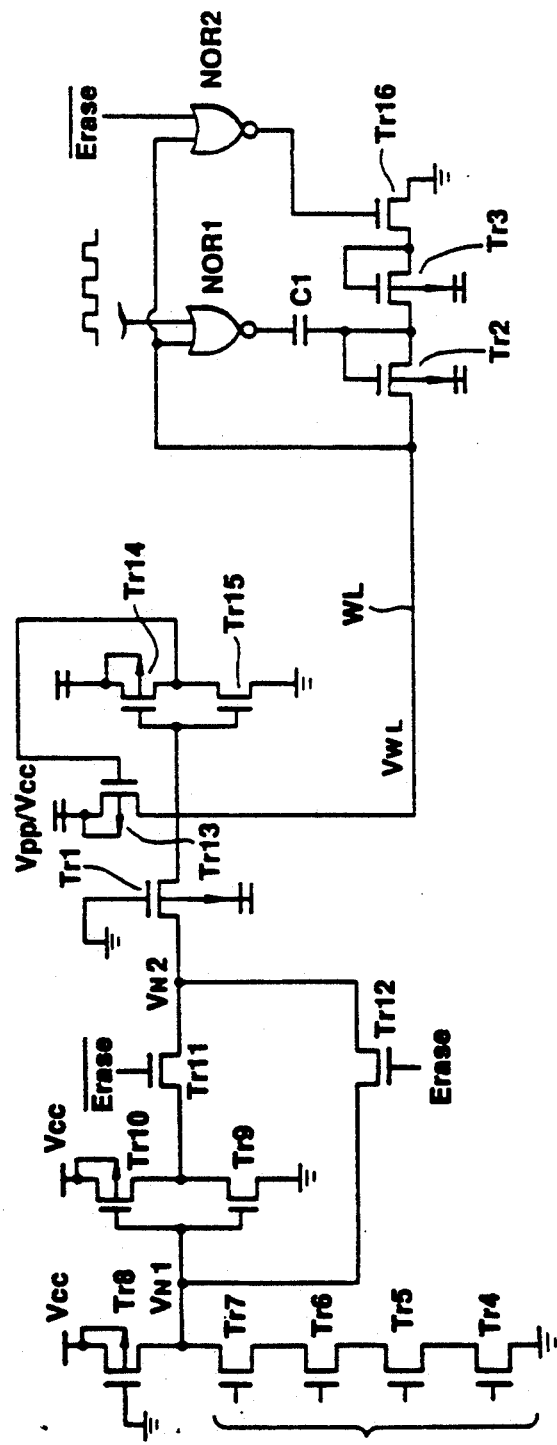
FIG. 5 is a circuit diagram of a modification of the row decoder of FIG. 3.

FIG. 5 shows a modification of the row decoder circuit of FIG. 3, which is also applicable for the preferred embodiment of the erasable programmable non-volatile memory device according to the invention. The shown modification improves the performance of the row decoder circuit of FIG. 3.

Namely, in the row decoder of FIG. 3, when one word line WL is not selected, the voltage level in the non-selected word line becomes not zero because of voltage shifted by the threshold voltage $V_{thp}$ of the transferring MOS transistor $Tr_1$. This causes a leak current in the non-selected blank memory, cell in writing and reading. Furthermore, in the erasure operation, since the word line voltage becomes 5 V, the non-selected blank memory cell is apt to be turned ON. For avoiding this, the source is made open or floating. Or, in the alternative, the voltage level at the source has to be raised to +5 V (+$V_{CC}$). In addition, during erasure operation, in the former embodiment, current tends to flow through the non-selected word line and the charge pump circuit to the ground. This increases power consumption for erasure operation.

In the modification of FIG. 5, the threshold voltage level $V_{thp}$ of the transferring MOS transistor $Tr_1$ is set at approximately 0 V (0±0.2 V). By setting the threshold voltage $V_{thp}$ of the transferring MOS transistor $Tr_1$ close to 0 V, the word line voltage $V_{WL}$ of the non-selected word line WL can be maintained at approximately 0 V during writing and reading operations. This successfully prevents the leak current from flowing through the blank memory cell.

In addition, in the construction of the row decoder circuit of FIG. 5, the output of the NOR gate $NOR_2$ is applied to the MOS transistor $Tr_{16}$. The NOR gate $NOR_2$ receives the erasure command $\overline{Erase}$ at one input terminal and the word line voltage $V_{WL}$ at the other input terminal. With this circuit construction, the NOR gate is turned OFF by the 5 V of the non-selected word line WL. Therefore, the voltage in the charge pump circuit will never affect for the non-selected word line.

Figure 6:
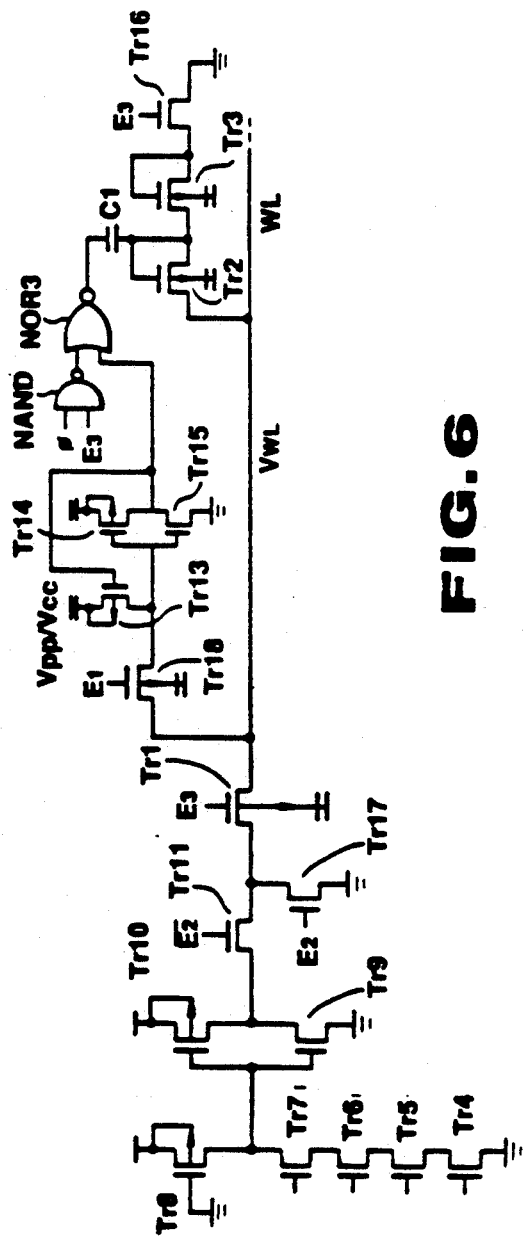
FIG. 6 is a circuit diagram of another modification of the row decoder of FIG. 3.

FIG. 6 shows another modification of the row decoder circuit which also improves the defects in the embodiment of FIG. 3.

Figure 7:
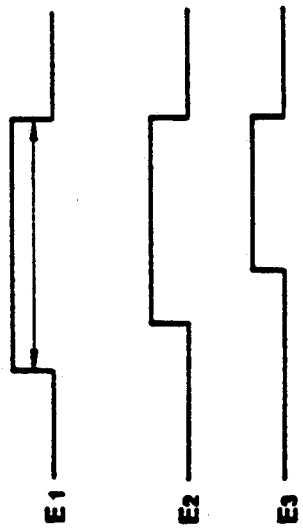
FIG. 7 is a chart showing waveforms of control signals for erasure.

The row decoder of FIG. 6 is designed to latch word lines by recognizing selected word lines and non-selected word lines before performing an erasure operation. In the erasure operation, the charge in the respective word lines WL is initially discharged to set at 0 V. Thereafter, the negative voltage for erasure is applied for the selected word lines WL. FIG. 7 shows wave forms of control signals $E_1$, $E_2$ and $E_3$ used in this modification. The signal levels of these control signals $E_1$, $E_2$ and $E_3$ during writing and reading are maintained at 0 V. In this modification, it is not required to reverse logic in the word lines WL between write/read mode operation and erasure mode operation.

In the shown circuit construction, the MOS transistors $Tr_{13}$, $Tr_{14}$ and $Tr_{15}$ basically operate to adjust the word line voltage $V_{WL}$ to $V_{PP}$ during a programming operation and to $V_{CC}$ during a reading operation. In the shown embodiment, these MOS transistors $Tr_{13}$, $Tr_{14}$ and $Tr_{15}$ serve for latching signals on the word lines to store information of selected word lines and non-selected word lines. Namely, when the control signal $E_1$ turns into a HIGH level, the MOS transistor $Tr_{18}$ is turned OFF. At this, the signals on respective word lines WL are latched by the MOS transistors $Tr_{13}$, $Tr_{14}$ and $Tr_{15}$. With a certain delay of the leading edge of the HIGH level control signal $E_1$, the HIGH level control signal $E_2$ rises. In response to raising of the HIGH level control signal $E_2$, the MOS transistor $Tr_{11}$ is turned OFF. Simultaneously, the MOS transistor $Tr_{17}$ is turned ON to allow the charge in respective word WL to be discharged. By this, the voltage level at each respective word line WL is set at 0 V. Thereafter, the HIGH level control signal $E_3$ rises to turn the transferring MOS transistor $Tr_1$ OFF. At this condition, according to the output of the circuit of the MOS transistors $Tr_{13}$, $Tr_{14}$ and $Tr_{15}$, the charge pump circuit is selectively operated according to the charge pulse $\phi$ generated by the circuit of the MOS transistors $Tr_{13}$, $Tr_{14}$ and $Tr_{15}$ to feed negative voltage for the selected word lines.

It should be appreciated that, in the modification shown in FIG. 6, the threshold voltage level $V_{th}$ of the transferring MOS transistor $Tr_1$ is also set at $0\pm0.2$ V Here, in erasure of the erasable programmable nonvolatile memory device, such as an EEPROM by injecting the holes in the floating gate, it is essential to avoid excessive holes to be injected into the floating gate. Otherwise, cell current will flow in the control gate even when the voltage at the non-selected word line is controlled at 0 V. This can be avoided by fabricating the control gate as proposed in ISSCC Digest, page 76 to page 77, 1987. However, this may prevent the integration from being satisfactorily high. Therefore, in the preferred embodiment, an erasure operation is performed by adjusting $V_{CC}$ at approximately 4 V for 10 to 100 microseconds. Subsequently a blank check is performed. Erasure and blank check operations are repeated for several cycles. When sufficient blank conditions cannot be obtained after given cycles of erasure and blank check operation, the $V_{CC}$ level is slightly risen.

Since the absolute value of the negative voltage is proportional to the source power $V_{CC}$, the negative voltage can be controlled by adjusting $V_{CC}$. Such process is effective for avoiding creation of excessive hall. In addition, writing operation is performed by writing utilizing 0.1 to 1 milliseconds width write pulse and subsequently perform verification, and repeating writing and verifying for several cycles.

As set forth, the shown embodiment of the erasable programmable nonvolatile memory device according to the present invention is enabled to electrically erase the written data. Therefore, even when the EEPROM is fabricated on the plastic package, a write test can be performed after assembling. This clearly improves reliability of the products. Furthermore, since as illustrated hereabove, since the construction of each memory cell is identical to the UV-EPROM, high integration can be obtained for allowing the memory device to be compact comparable with the UV-EPROM.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. An erasable programmable nonvolatile memory device comprising:
   a plurality of memory cells, each memory cell including a semiconductor region; source and drain regions formed in said semiconductor region; a channel region formed between said source and drain regions; a floating gate formed above said channel region; a first insulating layer disposed between said channel region and said floating gate; a control gate formed above said floating gate; and a second insulating layer disposed between said floating gate and said control gate;
   means for applying a positive voltage to said control gate for injecting electrons in said floating gate for injecting holes in said floating gate for erasure of said memory cells, wherein said means is connected to said control gate of said memory cells via a word line which is connected to a word line decoder via a transferring MOS transistor, said transferring MOS transistor being formed in a well region of said semiconductor region; and
   wherein said well region is biased at a level equal to or reversely to a source region of said transferring MOS transistor.

2. An erasable, programmable nonvolatile memory device as set forth in claim 1, wherein said transferring MOS transistor is designed for operation in a depletion mode.

3. An erasable programmable nonvolatile memory device comprising:
   a plurality of memory cells, each memory cell including a semiconductor region defining therein a source region, a drain region, and a channel region defined between said source and drain regions, a floating gate formed above said channel region and insulated therefrom, and a control gate formed above said floating gate and insulated therefrom, each memory cell being designed for writing in a bit data by injecting electrons in said floating gate; and
   means for applying an erasure voltage to said control gate for lowering a gate junction breakdown voltage at a junction between said semiconductor region and said drain region, and applying a drain voltage for causing breakdown at said junction so as to inject holes in said floating gate for erasure of bit data from said memory cells;

wherein said means transfers said erasure voltage through said word line; and wherein said means is connected to said control gate of said memory cells via said word line which is connected to a word line decoder via a transferring MOS transistor, said MOS transistor being formed in a well region of said semiconductor region; and wherein said well region is biased at a level equal to or reversely to a source region of said transferring MOS transistor.

4. An erasable programmable nonvolatile memory device as set forth in claim 3, wherein said transferring MOS transistor is designed for operation in a depletion mode.

5. An erasable programmable nonvolatile memory device comprising:

a plurality of memory cells, each memory cell including a semiconductor region; source and drain regions formed in said semiconductor region; a channel region formed between said source and drain regions; a floating gate formed above said channel region; a first insulating layer disposed between said channel region and said floating gate; a control gate formed above said floating gate; and a second insulating layer disposed between said floating gate and said control gate;

means for applying a positive voltage having a first predetermined amplitude to said control gate and a second predetermined voltage to said drain region for injecting electrons in said floating gate for writing data into said memory cells and applying a negative voltage having a third predetermined amplitude lower than said first predetermined amplitude to said control gate and a voltage having said second predetermined voltage to said drain region for injecting holes in said drain region for injecting holes in said floating gate for erasure of data from said memory cells;

wherein said means is connected to said control gate of said memory cells via a word line which is connected to a word line decoder via a transferring MOS transistor, said transferring MOS transistor being formed in a well region of said semiconductor region;

wherein said well region is biased at a level equal to or reversely to a source region of said transferring MOS transistor; and wherein said first insulating layer and second insulating layer are integrally formed as a common insulating package.

* * * * *